United States Patent
Chen et al.

(10) Patent No.: US 12,431,431 B2
(45) Date of Patent: Sep. 30, 2025

(54) CONDUCTIVE STRUCTURE INTERCONNECTS WITH DOWNWARD PROJECTIONS

(71) Applicant: Taiwan Semiconductor Manufacturing Company, Ltd., Hsinchu (TW)

(72) Inventors: Tzu Pei Chen, Taipei (TW); Chia-Hao Chang, Hsinchu (TW); Shin-Yi Yang, Taipei (TW); Chia-Hung Chu, Taipei (TW); Po-Chin Chang, Taichung (TW); Shuen-Shin Liang, Hsinchu (TW); Chun-Hung Liao, Taichung (TW); Yuting Cheng, Taoyuan (TW); Hung-Yi Huang, Hsinchu (TW); Harry Chien, Chandler, AZ (US); Pinyen Lin, Rochester, NY (US); Sung-Li Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 559 days.

(21) Appl. No.: 17/804,919

(22) Filed: Jun. 1, 2022

(65) Prior Publication Data
US 2023/0395504 A1    Dec. 7, 2023

(51) Int. Cl.
H01L 23/532    (2006.01)
H01L 21/768    (2006.01)

(52) U.S. Cl.
CPC .. *H01L 23/53238* (2013.01); *H01L 21/76834* (2013.01); *H01L 21/76843* (2013.01); *H01L 21/76877* (2013.01)

(58) Field of Classification Search
CPC ......... H01L 23/53238; H01L 21/76834; H01L 21/76877
USPC ....................................................... 257/751
See application file for complete search history.

(56) References Cited

U.S. PATENT DOCUMENTS

2014/0048939 A1* 2/2014 Park .................. H01L 21/76852
                                                      438/653
2016/0163587 A1* 6/2016 Backes ............. H01L 23/53238
                                                      257/751

* cited by examiner

*Primary Examiner* — Quoc D Hoang
(74) *Attorney, Agent, or Firm* — Ingrassia Fisher & Lorenz, LLP

(57) ABSTRACT

Provided are devices with conductive contacts and methods for forming such devices. A method includes forming a lower conductive contact in a dielectric material and over a structure, wherein the lower conductive contact has opposite sidewalls that extend to and terminate at a top surface. The method also includes separating an upper portion of each sidewall from the dielectric material and locating a barrier material between the upper portion of each sidewall and the dielectric material. Further, the method includes forming an upper conductive contact over the lower conductive contact.

20 Claims, 9 Drawing Sheets

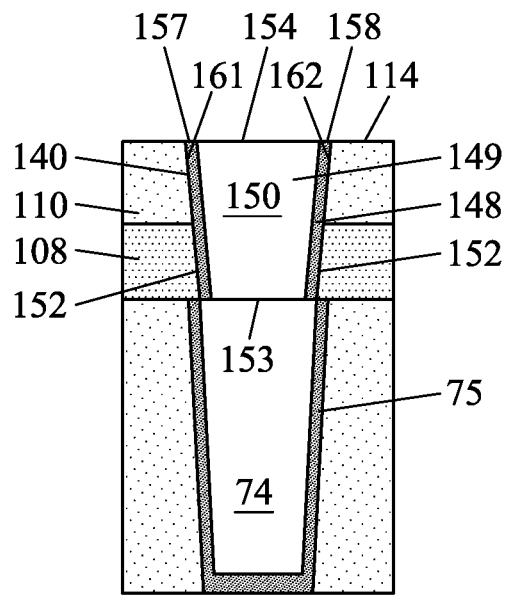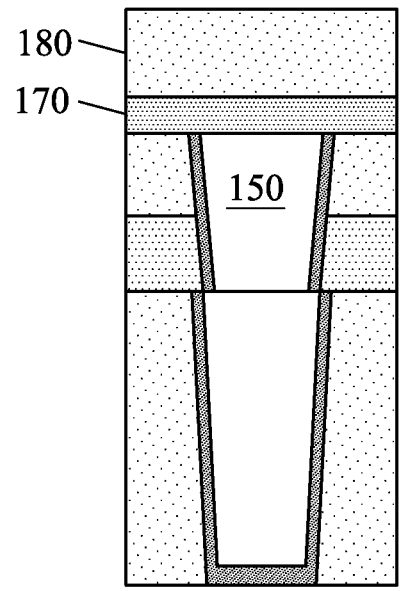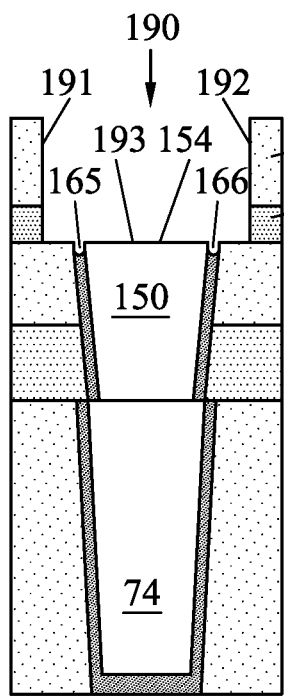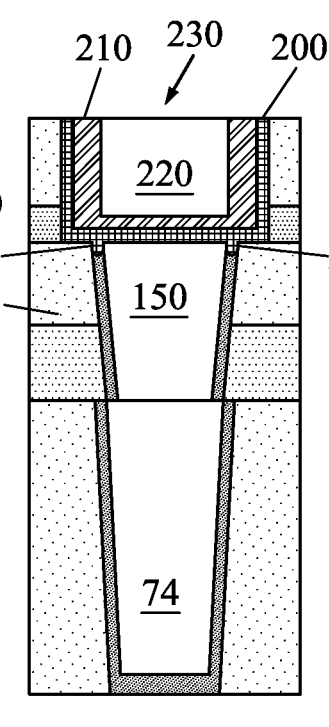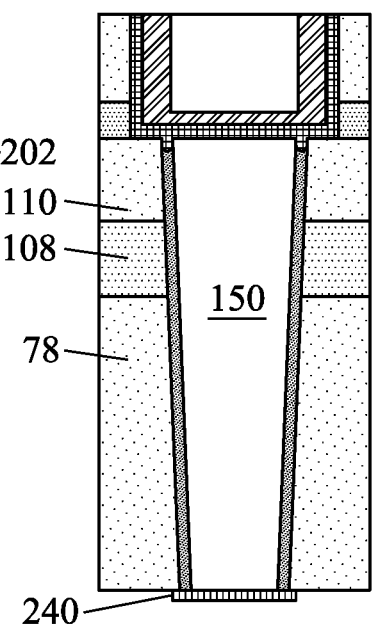
FIG. 14    FIG. 15
FIG. 17    FIG. 17    FIG. 18

CONDUCTIVE STRUCTURE INTERCONNECTS WITH DOWNWARD PROJECTIONS

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (e.g., the number of interconnected devices per chip area) has generally increased while geometry size (e.g., the smallest component (or line) that can be created using a fabrication process) has decreased. This scaling down process generally provides benefits by increasing production efficiency and lowering associated costs.

Accompanying the scaling down of devices, manufacturers have begun using new and different materials and/or combination of materials to facilitate the scaling down of devices. Scaling down, alone and in combination with new and different materials, has also led to challenges that may not have been presented by previous generations at larger geometries.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 14-17 illustrates a focused cross-sectional view of another interconnect structure of FIG. 6 during further processing, in accordance with some embodiments.

FIG. 18 is a focused cross-sectional view of an alternative interconnect structure similar to the structure of FIG. 17, in accordance with some embodiments.

DETAILED DESCRIPTION

Figure 1:
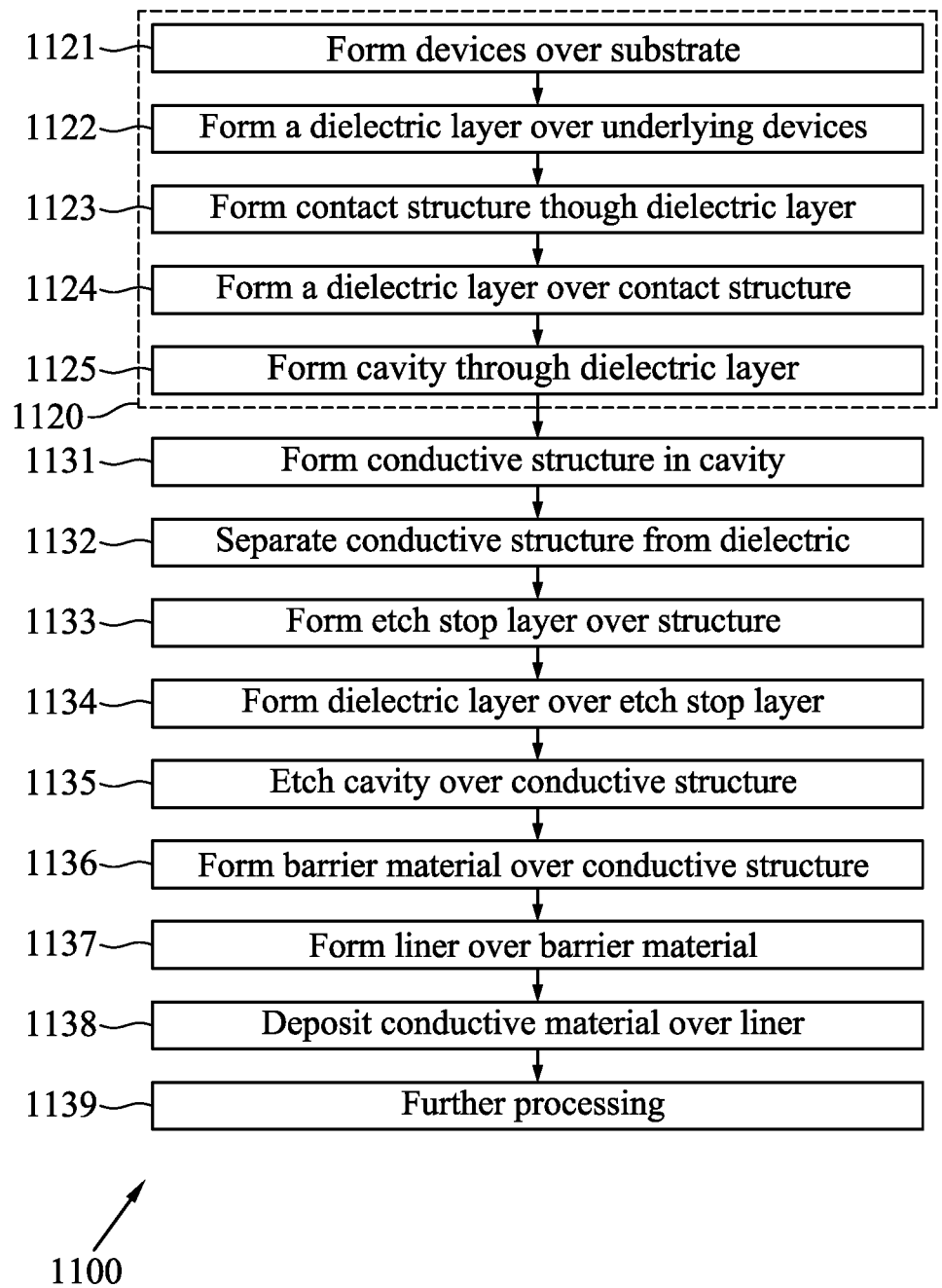
FIG. 1 is a flow chart illustrating a method for forming a semiconductor device including an interconnection between conductive structures, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "over", "overlying", "above", "upper", "top", "under", "underlying", "beneath", "below", "lower", "bottom", "side", and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

When a spatially relative term, such as those listed above, is used to describe a first element with respect to a second element, the first element may be directly on the other element, or intervening elements or layers may be present. When an element or layer is referred to as being "on" another element or layer, it is directly on and in contact with the other element or layer.

In certain embodiments herein, a "material layer" is a layer that includes at least 50 wt. % of the identified material, for example at least 60 wt. % of the identified material, or at least 75 wt. % of the identified material, or at least 90 wt. % of the identified material; and a layer that is a "material" includes at least 50 wt. % of the identified material, for example at least 60 wt. % of the identified material, at least 75 wt. % of the identified material, or at least 90 wt. % of the identified material. For example, certain embodiments, each of a titanium nitride layer and a layer that is titanium nitride is a layer that is at least 50 wt. %, at least 60 wt. %, at least 75 wt. %, titanium nitride, or at least 90 wt. % titanium nitride.

For the sake of brevity, conventional techniques related to conventional semiconductor device fabrication may not be described in detail herein. Moreover, the various tasks and processes described herein may be incorporated into a more comprehensive procedure or process having additional functionality not described in detail herein. In particular, various processes in the fabrication of semiconductor devices are well-known and so, in the interest of brevity, many conventional processes will only be mentioned briefly herein or will be omitted entirely without providing the well-known process details. As will be readily apparent to those skilled in the art upon a complete reading of the disclosure, the structures disclosed herein may be employed with a variety of technologies, and may be incorporated into a variety of semiconductor devices and products. Further, it is noted that semiconductor device structures include a varying number of components and that single components shown in the illustrations may be representative of multiple components.

Conductive structures, such as conductive contacts, plugs, or lines and metallization layers in an interconnect structure, and methods of forming the same are provided, according to some embodiments. In certain embodiments, a conductive structure is formed with a top surface covered by a barrier layer. Further, the conductive structure is formed with sidewalls, upper portions of which are surrounded by the barrier layer. As a result, the total surface area of the conductive structure in contact with the barrier layer is increased as compared to conventional processing in which only the top surface contacts the barrier layer. In certain embodiments, such a structure prevents diffusion of conductive material.

In certain embodiments, methods provide for forming a conductive structure in an opening or cavity in a dielectric layer, forming a pocket at the interface between the conductive structure and the dielectric layer, and then locating barrier material in the pocket. As a result, the structure may be formed with a barrier layer having a profile similar to that of "tiger teeth", i.e., the structure includes two downward projections interconnected by a lateral bridge.

In exemplary embodiments, the upper joints or corners of a conductive structure are embedded in, or surrounded by, a barrier material such that a minimum distance from each upper corner to non-barrier material is established. In other words, the barrier material has a minimum thickness surrounding each upper corner of the conductive structure, both in the traditional vertical direction, and in the lateral horizontal direction, and in the various lateral directions. As a result, diffusion of the conductive structure material is reduced or elimination.

In exemplary embodiments, the material forming the conductive structure includes grains and has a top grain boundary. In exemplary embodiments, the top grain boundary is located at a boundary depth below the top surface of the conductive structure. Further, in such embodiments, a barrier layer overlying the conductive structure includes downward projection that extend to a depth greater than the boundary depth.

Figure 2:
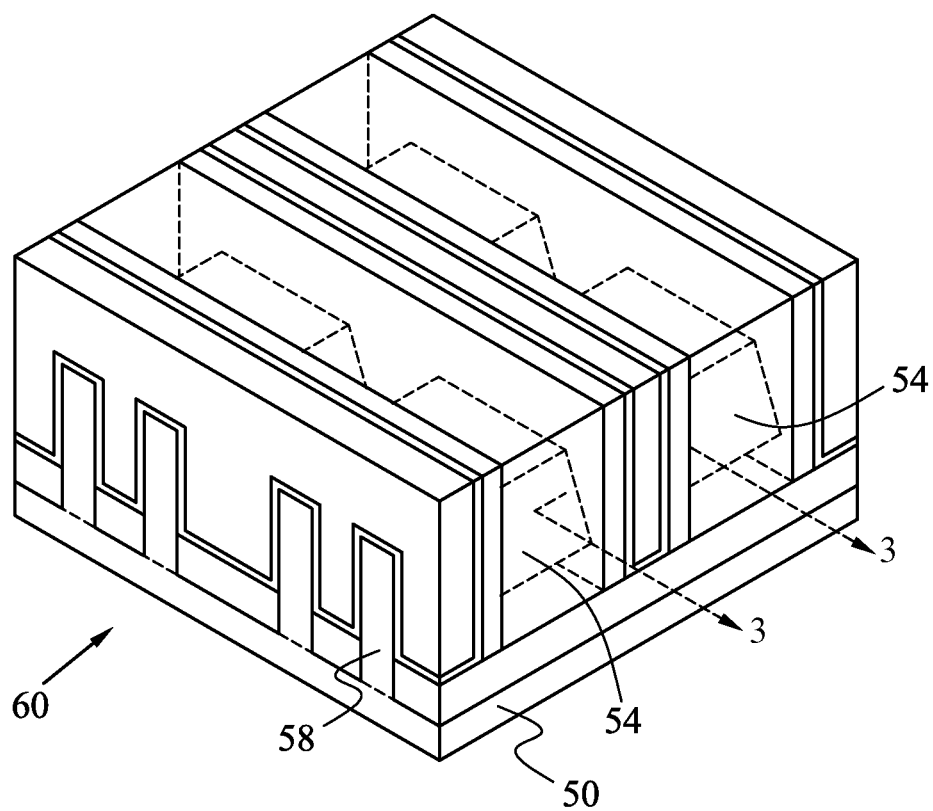
FIG. 2 is a perspective view of a semiconductor device in accordance with some embodiments.

FIG. 1 is a flow chart illustrated a method according to embodiments herein. FIG. 1 is described in conjunction with FIGS. 2-11 which illustrate a semiconductor device 40 at various stages of fabrication in accordance with some embodiments of the present disclosure of the method 1100. FIG. 2 is a perspective view of a semiconductor device 40 illustrating the layout of the fins 58 and source/drain regions 54 and does not illustrate processing to form conductive features. FIGS. 3-11 illustrate cross-sectional views, such as along line 3-3 in FIG. 2, of intermediate stages in the formation of conductive features and interconnect structures of semiconductor devices, in accordance with some embodiments. While the Figures may illustrate formation of conductive lines and/or a metallization layer (including metallization lines and conductive vias) of an interconnect structure using a single damascene process, dual damascene processes are also contemplated.

The method 1100 is merely an example, and is not intended to limit the present disclosure beyond what is explicitly recited in the claims. Additional steps may be provided before, during, and after method 1100, and some of the steps described can be moved, replaced, or eliminated for additional embodiments of method 1100. Additional features may be added in the semiconductor device depicted in the Figures and some of the features described below can be replaced, modified, or eliminated in other embodiments of the semiconductor device.

Figure 3:
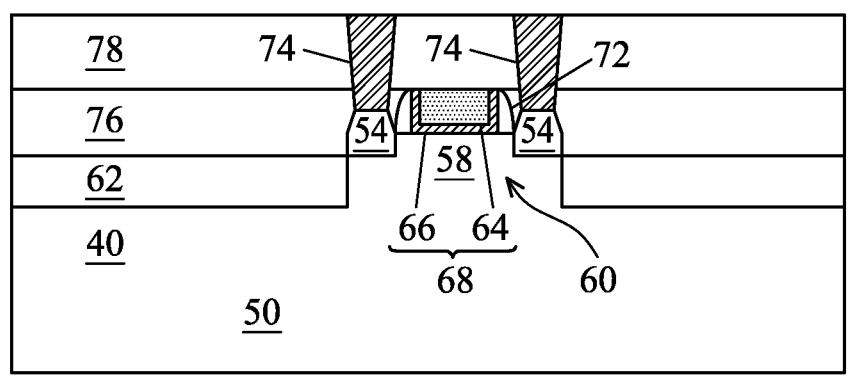
FIG. 3-6 illustrate cross-sectional views of intermediate stages in the formation of a semiconductor device including an interconnection between conductive structures, such as taken along line 3-3 in FIG. 2, in accordance with some embodiments.

As shown in FIG. 1, method 1100 includes, at operation 1121, forming devices over a substrate. FIG. 3 illustrates a cross-sectional view of a semiconductor device 40 on a wafer or substrate 50 (e.g., a semiconductor substrate) in which various electronic devices may be formed over the substrate 50, in accordance with some embodiments. In subsequent figures, a multilevel interconnect system may be formed over the various electronic devices and the substrate 50. Generally, as will be discussed in greater detail below, FIG. 3 illustrates a fin field effect transistor (FinFET) device 60 formed on a substrate 50, with multiple interconnection layers formed thereover in later figures. Planar transistors, gate-all-around (GAA) transistors, and other types of devices are within the contemplated scope of this disclosure, however.

Generally, the substrate 50 illustrated in FIG. 3 may comprise a bulk semiconductor substrate or a silicon-on-insulator (SOI) substrate. An SOI substrate includes an insulator layer below a thin semiconductor layer that is the active layer of the SOI substrate. The semiconductor of the active layer and the bulk semiconductor generally comprise the crystalline semiconductor material silicon, but may include one or more other semiconductor materials such as germanium, silicon-germanium alloys, compound semiconductors (e.g., GaAs, AlAs, InAs, GaN, MN, and the like), or their alloys (e.g., $_+Ga_xAl_{1-x}As$, $Ga_xAl_{1-x}N$, $In_xGa_{1-x}As$ and the like), oxide semiconductors (e.g., ZnO, $SnO_2$, $TiO_2$, $Ga_2O_3$, and the like) or combinations thereof. The semiconductor materials may be doped or undoped. Other substrates that may be used include multi-layered substrates, gradient substrates, or hybrid orientation substrates.

The FinFET device 60 illustrated in FIGS. 2 and 3 is a three-dimensional metal-oxide-semiconductor field effect transistor (MOSFET) structure formed in fin-like strips of semiconductor protrusions referred to as fins 58. The cross-section shown in FIG. 3 is taken along a longitudinal axis of the fin in a direction parallel to the direction of the current flow between the source and drain regions 54, such as along line 3-3 in FIG. 2. The fin 58 may be formed by patterning the substrate using photolithography and etching techniques. For example, a spacer image transfer (SIT) patterning technique may be used. In this method a sacrificial layer is formed over a substrate and patterned to form mandrels using suitable photolithography and etch processes. Spacers are formed alongside the mandrels using a self-aligned process. The sacrificial layer is then removed by an appropriate selective etch process. Each remaining spacer may then be used as a hard mask to pattern the respective fin 58 by etching a trench into the substrate 50 using, for example, reactive ion etching (RIE). FIG. 3 illustrates a single fin 58, although the substrate 50 may comprise any number of fins.

Fin isolation regions 62 formed along opposing sidewalls of the fin 58 are illustrated in FIG. 3. Fin isolation regions 62 may be formed by depositing one or more dielectric materials (e.g., silicon oxide) to completely fill the trenches around the fins and then recessing the top surface of the dielectric materials. The dielectric materials of the fin isolation regions 62 may be deposited using a high-density plasma chemical vapor deposition (HDP-CVD), a low-pressure CVD (LPCVD), sub-atmospheric CVD (SACVD), a flowable CVD (FCVD), spin-on, and/or the like, or a combination thereof. After the deposition, an anneal process or a curing process may be performed. In some cases, the fin isolation regions 62 may include a liner such as, for example, a thermal oxide liner grown by oxidizing the silicon surface. The recess process may use, for example, a planarization process (e.g., a chemical mechanical polish (CMP)) followed by a selective etch process (e.g., a wet etch, or dry etch, or a combination thereof) that may recess the top surface of the dielectric materials in the fin isolation region 62 such that an upper portion of the fins 58 protrudes from surrounding insulating fin isolation regions 62. In some cases, the patterned hard mask used to form the fins 58 may also be removed by the planarization process.

In some embodiments, the gate structure 68 of the FinFET device 60 illustrated in FIG. 3 is a high-k, metal gate (HKMG) gate structure that may be formed using a gate-last process flow. In a gate last process flow a sacrificial dummy gate structure (not shown) is formed after forming the fin isolation regions 62. The dummy gate structure may comprise a dummy gate dielectric, a dummy gate electrode, and a hard mask. First, a dummy gate dielectric material (e.g., silicon oxide, silicon nitride, silicon oxynitride, or the like) may be deposited. Next, a dummy gate material (e.g., amorphous silicon, polycrystalline silicon, or the like) may be deposited over the dummy gate dielectric and then planarized (e.g., by CMP). A hard mask layer (e.g., silicon nitride, silicon carbide, or the like) may be formed over the dummy gate material. The dummy gate structure is then formed by patterning the hard mask and transferring that pattern to the dummy gate dielectric and dummy gate material using suitable photolithography and etching techniques. The dummy gate structure may extend along multiple sides of the protruding fins 58 and extend between the fins 58 over the surface of the fin isolation regions 62. As described in greater detail below, the dummy gate structure may be replaced by the gate structure 68 as illustrated in FIG. 3. The gate structure 68 illustrated in FIG. 3 (seen on the top of fin 58) is an example of an active gate structure which extends, e.g., along sidewalls of and over the portion of fin 58 protruding above the fin isolation region 62. The materials used to form the dummy gate structure and hard mask may be deposited using any suitable method such as CVD, plasma-enhanced CVD (PECVD), atomic layer deposition (ALD), plasma-enhanced ALD (PEALD) or the like, or by thermal oxidation of the semiconductor surface, or combinations thereof.

Source and drain regions 54 and spacers 72 of FinFET device 60, illustrated in FIG. 3, are formed, for example, self-aligned to the dummy gate structures. Spacers 72 may be formed by deposition and anisotropic etch of a spacer dielectric layer performed after the dummy gate patterning is complete. The spacer dielectric layer may include one or more dielectrics, such as silicon oxide, silicon nitride, silicon oxynitride, silicon carbide, silicon carbonitride, the like, or a combination thereof. The anisotropic etch process removes the spacer dielectric layer from over the top of the dummy gate structures leaving the spacers 72 along the sidewalls of the dummy gate structures extending laterally onto a portion of the surface of the fin 58 (as illustrated in FIG. 3).

Source and drain regions 54 are semiconductor regions in contact with the fin 58. In some embodiments, the source and drain regions 54 may comprise heavily doped regions and relatively lightly doped drain (LDD) extensions. Generally, the heavily doped regions are spaced away from the dummy gate structures using the spacers 72, whereas the LDD regions may be formed prior to forming spacers 72 and, hence, extend under the spacers 72 and, in some embodiments, extend further into a portion of the semiconductor below the dummy gate structure. The LDD regions may be formed, for example, by implanting dopants (e.g., As, P, B, In, or the like) using an ion implantation process.

The source and drain regions 54 may comprise an epitaxially grown region. For example, after forming the LDD regions, the spacers 72 may be formed and, subsequently, the heavily doped source and drain regions may be formed self-aligned to the spacers 72. In particular, the heavily doped source and drain regions may be formed by first etching the fins to form recesses, and then depositing a crystalline semiconductor material in the recess by a selective epitaxial growth (SEG) process that may fill the recess and, typically, extend beyond and above the original surface of the fin to form a raised source-drain structure, as illustrated in FIG. 3. The crystalline semiconductor material may be elemental (e.g., Si, or Ge, or the like), or an alloy (e.g., Si1-xCx, or Si1-xGex, Si1-x-yGexCy, or the like). The SEG process may use any suitable epitaxial growth method, such as e.g., vapor/solid/liquid phase epitaxy (VPE, SPE, LPE), or metal-organic CVD (MOCVD), or molecular beam epitaxy (MBE), or the like. A high dose of dopants may be introduced into the heavily doped source and drain regions 54 either in situ during SEG, or by an ion implantation process performed after the SEG, or by a combination thereof. The source and drain regions 54 may be formed by other processes, such as ion implantation of dopants, and the like.

As shown in FIG. 3, a first interlayer dielectric (ILD) layer 76 is deposited over the structure. In some embodiments, a contact etch stop layer (CESL) (not shown) of a suitable dielectric (e.g., silicon nitride, silicon carbide, or the like, or a combination thereof) may be deposited prior to depositing the ILD material. A planarization process (e.g., CMP) may be performed to remove excess ILD material and any remaining hard mask material from over the dummy gates to form a top surface wherein the top surface of the dummy gate material is exposed and may be substantially coplanar with the top surface of the first ILD layer 76.

The HKMG gate structures 68, illustrated in FIG. 3, may then be formed by first removing the dummy gate structures using one or more etching techniques, thereby creating recesses between respective spacers 72. Next, a replacement gate dielectric layer 66 comprising one or more dielectrics, followed by a replacement conductive gate layer 64 comprising one or more conductive materials, may be deposited to completely fill the recesses. The gate dielectric layer 66 includes, for example, a high-k dielectric material such as oxides and/or silicates of metals (e.g., oxides and/or silicates of Hf, Al, Zr, La, Mg, Ba, Ti, and other metals), silicon nitride, silicon oxide, and the like, combinations thereof, or multilayers thereof. In some embodiments, the conductive gate layer 64 may be a multilayered metal gate stack comprising a barrier layer, a work function layer, and a gate-fill layer formed successively on top of gate dielectric layer 66. Example materials for a barrier layer include TiN, TaN, Ti, Ta, TiSiN, TaSiN, or the like, or a multilayered combination thereof. A work function layer may include TiN, TaN, Ru, Mo, Al, for a p-type FET, and Ti, Ag, TaAl, TaAlC, TiAlN, TaC, TaCN, TaSiN, Mn, Zr, for an n-type FET. Other suitable work function materials, or combinations, or multilayers thereof may be used. The gate-fill layer which fills the remainder of the recess may comprise metals such as Cu, Al, W, Co, Ru, or the like, or combinations thereof, or multi-layers thereof. The materials used in forming the gate structure may be deposited by any suitable method, e.g., CVD, PECVD, physical vapor deposition (PVD), ALD, PEALD, electrochemical plating (ECP), electroless plating and/or the like. Excess portions of the gate structure layers 64 and 66 may be removed from over the top surface of first ILD layer 76 using, for example a CMP process. The resulting structure, as illustrated in FIG. 3, may be a substantially coplanar surface comprising an exposed top surface of the first ILD layer 76, the spacers 72, and remaining portions of the HKMG gate layers (i.e., the gate structure layers 64 and 66) inlaid between respective spacers 72.

In FIG. 1, operation 1122 of method 1100 includes forming a dielectric layer over the underlying devices. As shown in FIG. 3, a second ILD layer 78 is deposited over the first ILD layer 76. In some embodiments, the insulating materials to form the first ILD layer 76 and the second ILD layer 78 may comprise silicon oxide, phosphosilicate glass (PSG), borosilicate glass (BSG), boron-doped phosphosilicate glass (BPSG), undoped silicate glass (USG), a low dielectric constant (low-k) dielectric such as, fluorosilicate glass (FSG), silicon oxycarbide (SiOCH), carbon-doped oxide (CDO), flowable oxide, or porous oxides (e.g., xerogels/aerogels), or the like, or a combination thereof. The dielectric materials used to form the first ILD layer 76 and the second ILD layer 78 may be deposited using any suitable method, such as CVD, PVD, ALD, PEALD, PECVD, SACVD, FCVD, spin-on, and/or the like, or a combination thereof. In some embodiments, one or more etch stop layers (not specifically illustrated) are also formed over the structure above and/or below the illustrated ILD layers.

In FIG. 1, operation 1123 of method 1100 includes forming conductive structures through the dielectric layer. As illustrated in FIG. 3, conductive connectors (e.g., lower contact structures or plugs 74) are formed through the intervening dielectric layers. The interconnect level including the contact structures 74 may be formed during so-called middle end-of-line (MEOL) processing. In certain embodiments, electrodes of electronic devices formed in the substrate 50 may be electrically connected to conductive features of a first or lower interconnect level (formed subsequently).

In the example illustrated in FIG. 3, the contact plugs 74 make electrical connections to the source and drain regions 54 of FinFET device 60. Contact plugs 74 to gate electrodes are typically formed over fin isolation regions 62. The contact plugs 74 may be formed using photolithography techniques. For example, a patterned mask may be formed over the second ILD layer 78 and used to etch openings that extend through the second ILD layer 78 to expose a portion of gate electrodes 64 over fin isolation regions 62, as well as etch openings over the fins 58 that extend further, through the first ILD layer 76 and the CESL (not shown) liner below first ILD layer 76 to expose portions of the source and drain regions 54. In some embodiments, an anisotropic dry etch process may be used wherein the etching is performed in two successive steps. The etchants used in the first step of the etch process have a higher etch rate for the materials of the first and second ILD layers 76 and 78 relative to the etch rate for the materials used in the conductive gate layer 64 and the CESL, which may be lining the top surface of the heavily doped regions of the source and drain regions 54. Once the first step of the etch process exposes the CESL, the second step of the etch process may be performed wherein the etchants may be switched to selectively remove the CESL. While the two ILD layers (e.g., the first ILD layer 76 and the second ILD layer 78) are illustrated, embodiments having only a single ILD layer, or having three or more ILD layers, are within the contemplated scope of this disclosure.

In the illustrated embodiments, the contact plug 74 is formed in direct contact with the surrounding dielectric 78 and surrounding contact etch stop layer (if present). In some embodiments, a conductive liner may be formed in the openings in the first ILD layer 76 and the second ILD layer 78. Subsequently, the openings are filled with a conductive fill material. An exemplary liner comprises barrier metals used to reduce out-diffusion of conductive materials from the contact plugs 74 into the surrounding dielectric materials. In some embodiments, the liner may include two barrier metal layers. The contact plug may be formed by depositing a contacts metal in contact with the semiconductor material in the source and drain regions 54 and subsequently chemically reacting the contact metal with the heavily doped semiconductor in the source and drain regions 54 to form a low resistance ohmic contact, after which the unreacted metal may be removed. For example, if the heavily doped semiconductor in the source and drain regions 54 is silicon or silicon-germanium alloy semiconductor, then the first barrier metal may comprise Ti, Ni, Pt, Co, other suitable metals, or their alloys. An overlying barrier metal layer of the conductive liner may include other metals (e.g., TiN, TaN, Ta, or other suitable metals, or their alloys). A conductive fill material (e.g., W, Al, Cu, Ru, Ni, Co, alloys of these, the like, or any combination thereof) may be deposited over the conductive liner layer to fill the contact openings, using any acceptable deposition technique (e.g., CVD, ALD, PEALD, PECVD, PVD, ECP, electroless plating, the like, or any combination thereof). Next, a planarization process (e.g., CMP) may be used to remove excess portions of all the conductive materials from over the surface of the second ILD layer 78. The resulting conductive plugs extend into the first and second ILD layers 76 and 78 and constitute contact plugs 74 making physical and electrical connections to the electrodes of electronic devices, such as a tri-gate FinFET device, as illustrated in FIG. 3. In this example, contacts to electrodes over fin isolation region 62 and to electrodes over fins 58 are formed simultaneously using the same processing steps. However, in other embodiments these two types of contacts may be formed separately.

Figure 4:
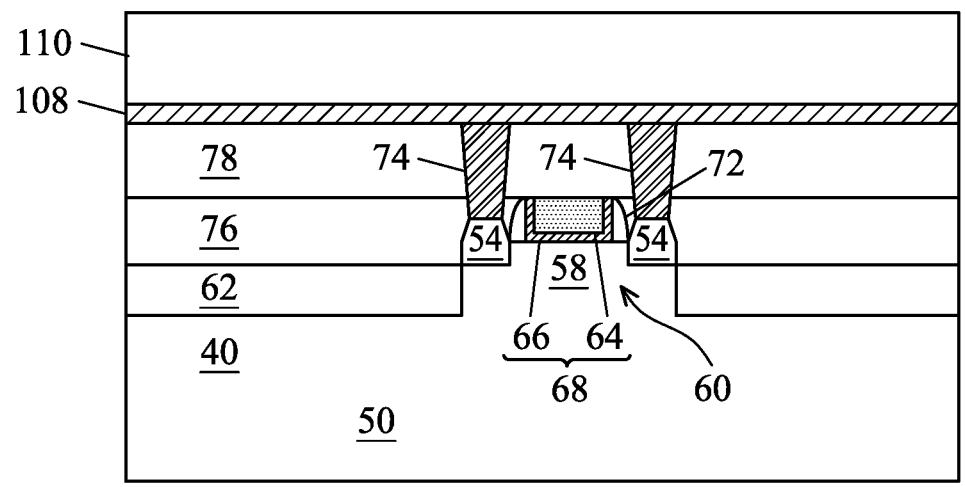

Method 1100 may continue with operation 1124, which includes forming a dielectric layer or layers over the contact structures 74. As shown in FIG. 4, operation 1124 include forming etch stop layer 108 over the FinFET devices 60 and other electronic devices, the second ILD layer 78, and the contact plugs 74. The etch stop layer 108 may be formed from silicon carbide, silicon nitride, silicon oxynitride, silicon carbo-nitride, or the like. The etch stop layer 108 may be formed by chemical vapor deposition (CVD), physical vapor deposition (PVD), atomic layer deposition (ALD), a spin-on-dielectric process, the like, or a combination thereof.

Still referring to FIG. 4, operation 1124 includes forming an inter-metal dielectric (IMD) layer 110 over the etch stop layer 108. The IMD layer 110 may be a layer formed from a low-k dielectric material having a k-value lower than about 3.0. The IMD layer 110 may be a layer formed from an extra-low-k (ELK) dielectric material having a k-value of less than 2.5. In some embodiments, the IMD layer 110 may be formed from an oxygen-containing and/or carbon containing low-k dielectric material, Hydrogen SilsesQuioxane (HSQ), MethylSilsesQuioxane (MSQ), or the like. The material of the etch stop layer 108 has a high etching selectivity with the IMD layer 110, and hence the etch stop layer 108 may be used to stop the etching of the IMD layer 110 in subsequent processing steps.

In some embodiments, the IMD layer 110 is formed from a porous material such as SiOCN, SiCN, SiOC, SiOCH, or the like and may be formed by initially forming a precursor layer over the etch stop layer 108. The precursor layer may include both a matrix material and a porogen interspersed within the matrix material, or may alternatively include the matrix material without the porogen. In some embodiments the precursor layer may be formed, for example, by co-depositing the matrix and the porogen using a process such as plasma enhanced chemical vapor deposition (PECVD) where the matrix material is deposited at the same time as the porogen, thereby forming the precursor layer with the matrix material and the porogen mixed together. However, as one of ordinary skill in the art will recognize, co-deposition using a simultaneous PECVD process is not the only process that may be used to form the precursor layer. Any suitable process, such as premixing the matrix material and the porogen material as a liquid and then spin-coating the mixture onto the etch stop layer 108, may also be utilized.

The matrix material, or base dielectric material, may be formed using a process such as PECVD, although any suitable process, such as a CVD, PVD, or even spin-on coating, may alternatively be utilized. The PECVD process may utilize precursors such as methyldiethoxysilane (DEMS), although other precursors such as other silanes, alkylsilanes (e.g., trimethylsilane and tetramethylsilane), alkoxysilanes (e.g., methyltriethoxysilane (MTEOS), methyltrimethoxysilane (MTMOS), methyldimethoxysilane (MDMOS), trimethylmethoxysilane (TMMOS) and dimethyldimethoxysilane (DMDMOS)), linear siloxanes and cyclic siloxanes (e.g., octamethylcyclotetrasiloxane (OMCTS) and tetramethylcyclotetrasiloxane (TMCTS)), combinations of these, or the like may alternatively be utilized. However, as one of ordinary skill in the art will recognize, the materials and processes listed herein are merely illustrative and are not meant to be limiting to the embodiments, as any other suitable matrix precursors may alternatively be utilized.

The porogen may be a molecule that can be removed from the matrix material after the matrix material has set in order to form pores within the matrix and thereby reduce the overall value of the dielectric constant of the IMD layer 110. The porogen may be a material that is big enough to form the pores while also remaining small enough such that the size of the individual pores does not overly displace the matrix material. As such, the porogen may include an organic molecule such as alpha-terpinene (ATRP) (1-Isopropyl-4-Methyl-1,3-Cyclohexadiene) or cyclooctane (boat shape) or 1,2-bis(triethoxysilyl) ethane silicon.

After the precursor layer has been formed with the porogen dispersed within the matrix material, the porogen is removed from the matrix material to form the pores within the matrix material. In an embodiment the removal of the porogen is performed by an annealing process which can break down and vaporize the porogen material, thereby allowing the porogen material to diffuse and leave the matrix material, thereby leaving behind a structurally intact porous dielectric material as the IMD layer 110. For example, an anneal of in a range from about 200° C. and about 500° C., such as about 400° C., for in a range from about 10 seconds to about 600 seconds, such as about 200 seconds, may be utilized. Alternatively, other suitable processes may be used to remove the porogen, such as irradiating the porogen with ultraviolet (UV) radiation to decompose the porogen or utilizing microwaves to decompose the porogen.

Operation 1125 of method 1100 includes forming cavities in the dielectric layer over the contact structures. For example, in FIG. 5, a film stack is formed over the IMD layer 110. In accordance with some embodiments, the film stack is used to form conductive lines that are electrically connected to the contact plugs 74 and substrate 50. The film stack includes a buffer layer 124 and a mask layer 126. In some embodiments, the film stack includes more than one buffer layer and mask layer, which may be formed in alternating fashion.

The buffer layer 124 is formed over the IMD layer 110, and the mask layer 126 is formed over the buffer layer 124. The buffer layer 124 may be formed from a dielectric, such as silicon oxide, and may be formed by CVD, PVD, ALD, a spin-on-dielectric process, or the like. The mask layer 126 may be formed from a material that includes a metal, such as titanium nitride, titanium, tantalum nitride, tantalum, or the like, and may be formed by PVD, Radio Frequency PVD (RFPVD), ALD, or the like. In subsequent processing steps, a pattern is formed on the mask layer 126. The mask layer 126 is then used as an etching mask, where the pattern of the mask layer 126 is used to etch the IMD layer 110. The buffer layer 124 provides stress reduction between the IMD layer 110 and the mask layer 126.

Figure 5:
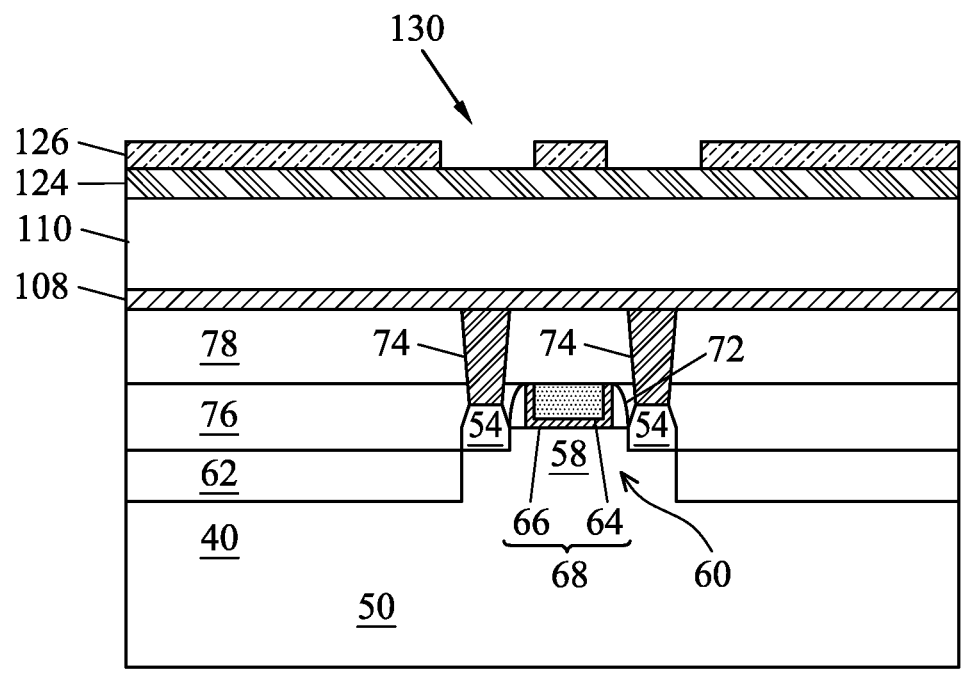

In FIG. 5, openings 130 are formed in the mask layer 126. Formation of the openings 130 may include performing a photolithography process to etch the mask layer 126 in order to form initial openings. The photolithography process may include forming a photoresist (not specifically illustrated) over the mask layer 126, patterning the photoresist with openings corresponding to the openings 130 extending the openings 130 through the mask layer 126, and then removing the photoresist.

Figure 6:
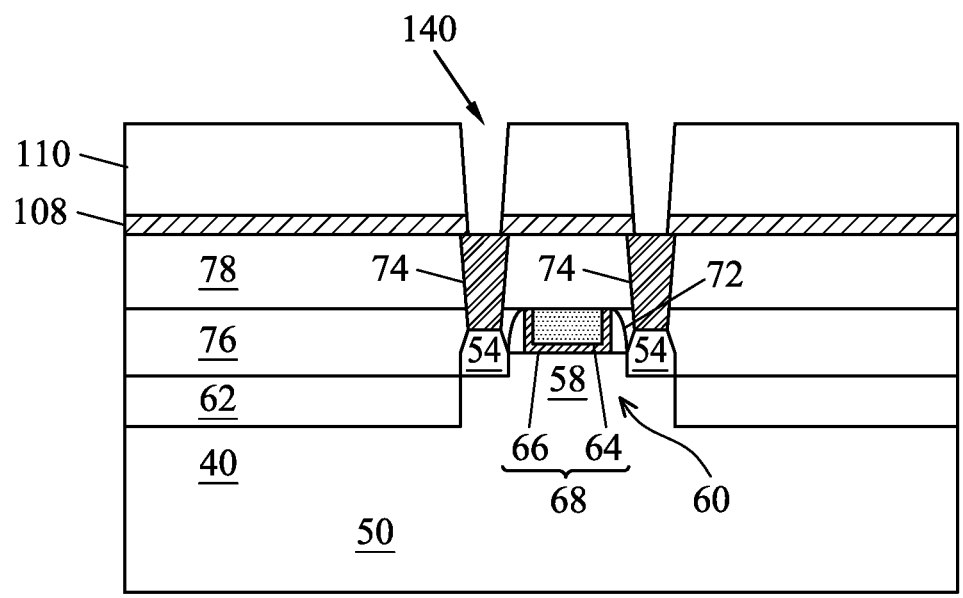

As shown in FIG. 6, the openings 130 are extended through the buffer layer 124, the IMD layer 110, and the etch stop layer 108 to form cavities 140 landing on respective contact structures or plugs 74. The openings 130 may be extended by using acceptable etching techniques. In an embodiment, the openings 130 are first extended by an anisotropic dry etch process. For example, the etching process may include a dry etch process using a reaction gas that selectively etches the IMD layer 110 without significantly etching the mask layer 126. The etching process is performed until the openings 130 expose the etch stop layer 108. For example, the etching process may include the formation of a reactive species from an etchant gas using a plasma. In some embodiments, the plasma may be a remote plasma. The etchant gas may include a fluorocarbon chemistry such as $C_4F_6/CF_4/C_5F$ and $NF_3/O_2/N_2/Ar/H_3/H_2$, the like, or a combination thereof. In some embodiments, the etchant uses fluorocarbon chemistry with $O_2$ or Ar as the carrier gas.

Thereafter, portions of the etch stop layer 108 are removed to form the cavities 140 exposing the underlying target contact plugs 74. The etch stop layer 108 may be removed using an anisotropic wet or dry etch that is selective to the material of the etch stop layer 108. For example, the etch stop layer 108 may be removed using an anisotropic wet etch that uses etchant reactants such as $H_2O_2$. The etching process used to remove the etch stop layer 108 may be different from the etching processes used to etch the buffer layer 124 and the IMD layer 110 to extend the openings 130 (e.g., different etchants and/or other etching process parameters may be used). As shown in FIG. 6, the mask layer 126 and the buffer layer 124 may be removed.

As shown in FIG. 1, operations 1121 through 1125 form a process 1120 for providing a semiconductor device 40 ready for formation of a conductive structure. After completion of process 1120, formation of the conductive structure may begin.

Figure 7:
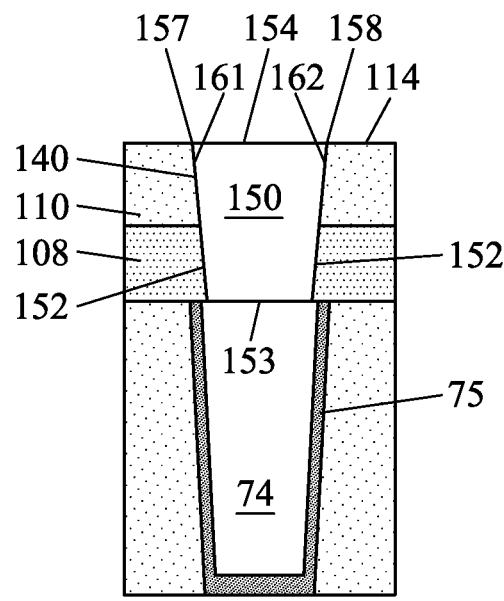
FIGS. 7-11 illustrates a focused cross-sectional view of an interconnect structure of FIG. 6 during further processing, in accordance with some embodiments.

Operation 1131 of method 1100 includes forming conductive structures in the cavities. For example, FIG. 7 is a focused view of a selected lower conductive structure 74 of FIG. 6 during further processing for forming conductive features of a second or intermediate interconnect level (formed subsequently) using conductive connectors (e.g., intermediate contact structures or plugs 150) formed through the intervening dielectric layers. It is noted that FIG. 7 illustrates that the lower conductive structure 74 includes a liner or barrier layer 75.

As shown, a conductive material is deposited in the cavity 140 and is planarized to form an intermediate conductive structure 150 with a top surface 154 co-planar with a top surface 114 of the dielectric material 110. In the illustrated embodiments, the conductive structure 150 is formed in direct contact with the surrounding dielectric 110 and surrounding contact etch stop layer 108. In some embodiments, a liner may be formed in the cavity 140 along the cavity sides and cavity bottom before the cavity 140 is filled with the conductive fill material. An exemplary liner comprises barrier metals used to reduce out-diffusion of conductive materials from the conductive structure 150 into the surrounding dielectric materials, and may be formed according to the description above related to the lower metallization layer.

As shown in FIG. 7, the conductive structure 150 has opposite sidewalls, including a first sidewall 151 and a second sidewall 152, that each extend from a bottom surface 153 to a top surface 154. The bottom surface 153 in conductive contact with the underlying conductive structure 74.

It is noted that the opposite sidewalls 151 and 152 are considered from the cross-sectional views of FIGS. 3-12. For example, a top view of the conductive structure 150 may indicate that the conductive structure has a circular or other round cross-section shape such as may be formed by a single continuous rounded wall. As used herein, the "opposite sidewalls" 151 and 152 may be portions of a same continuous rounded wall. Such opposite sidewalls 151 and 152 exist within a same plane, e.g., the plane of the drawing sheets in FIGS. 3-13 and may be considered within the context of a vertical cross section of a conductive structure 150 having a shape including a cylindrical or conical shape formed by a single continuous rounded wall.

In the illustrated embodiment, each sidewall 151 and 152 is in direct contact with the etch stop layer 108 and the dielectric layer 110 along a respective interface 161, 162. Specifically, a lower portion of each sidewall 151, 152 is in direct contact with the etch stop layer 108, and an upper portion of each sidewall 151, 152 is in direct contact with the dielectric layer 110. As shown, each sidewall 151, 152 intersects the top surface 154 at a respective joint or corner 157, 158, each of which is illustrated as an angular edge but may be rounded.

Method 1100 continues with operation 1132 including separating an upper portion of each sidewall from the dielectric material.

In an exemplary embodiment, separating the upper portions of the sidewalls 151, 152 from the dielectric material 110 may be performed by a chemical mechanical planarization process. For example, a CMP slurry composition may be formed by selecting an abrasive, oxidizer, chelator, pH adjuster, and surfactant. An exemplary CMP slurry composition has a pH of from 4 to 12. In an exemplary embodiment, the slurry composition includes less than 6 wt. % of abrasive, and less than 3 wt. % of other chemicals. An exemplary CMP slurry composition includes an abrasive selected from $TiO_2$, $SiO_2$, $CeO_2$, $ZrO_2$, and $Al_2O_3$; an oxidizer selected from $H_2O_2$, $H_5IO_6$, and $FeNO_3$; a chelator selected from $NH_3$, EDTA, "Amine Chelator": $NH_3$, EDTA, "Amine Chelator": $NH_3$, EDTA, and amine; a pH adjustor selected from KOH, citric acid ($C_6H_8O_7$), acetic acid, and organic $NH_4OH$; and a surfactant selected from organic acid, alcohol, EDTA, and acetic acid. In an exemplary embodiment, the slurry is dispensed over the top surfaces 114 and 154 while polishing pads rotate against the surfaces 114 and 154.

The slurry may etch the dielectric material 110 and the conductive structure 150 along the interfaces 161 and 162. In exemplary embodiments, the slurry has a higher etching rate at weak interfaces, such as a ruthenium/dielectric interface. Generally, the slurry etches the dielectric material 110 at a higher etching rate than the slurry etches the conductive structure 150. In certain embodiments, the CMP process etches the dielectric material 110 at the interfaces 161 and 162, or etches the dielectric material 110 and the conductive structure 150 at the interfaces 161 and 162.

Figure 8:
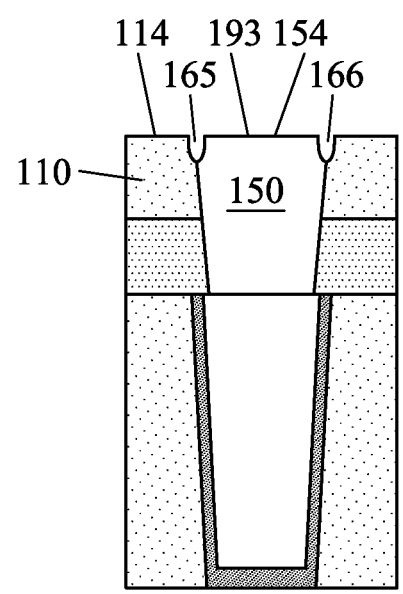

As shown in FIG. 8, separating an upper portion of each sidewall from the dielectric material may include forming a first pocket or void 165 adjacent to the first sidewall 151 and a second pocket or void 166 adjacent to the second sidewall 152. As shown, each pocket 165, 166 extends downwardly from the top surface 154.

Figure 9:
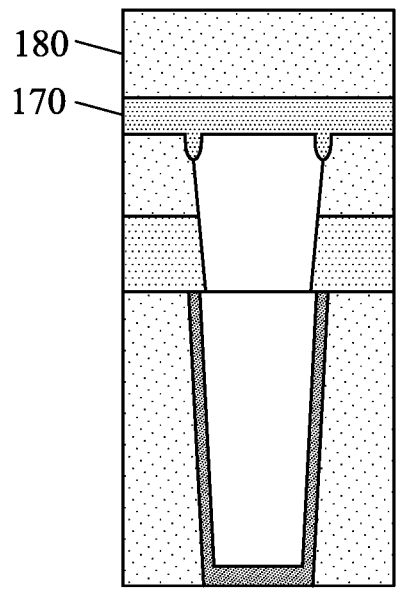

Method 1100 continues at operation 1133 with forming an etch stop layer over the structure of FIG. 8. As shown in FIG. 9, an etch stop layer 170 is formed over the dielectric layer 110 and the conductive structure 150. The etch stop layer 170 may be formed of similar materials and by a similar process as described above in connection with the etch stop layer 108. In exemplary embodiments, the etch stop layer 170 fills the pockets 165 and 166.

Method 1100 continues at operation 1134 with forming a dielectric layer over the etch stop layer 170. As shown in FIG. 9, a dielectric layer 180, such as an IMD layer, is formed over the etch stop layer 170. Dielectric layer 180 may be formed of similar materials and by a similar process as described above in connection with the IMD layer 110. The material of the etch stop layer 170 has a high etching selectivity with the IMD layer 180, and hence the etch stop layer 170 may be used to stop the etching of the IMD layer 180 in subsequent processing steps.

Figure 10:
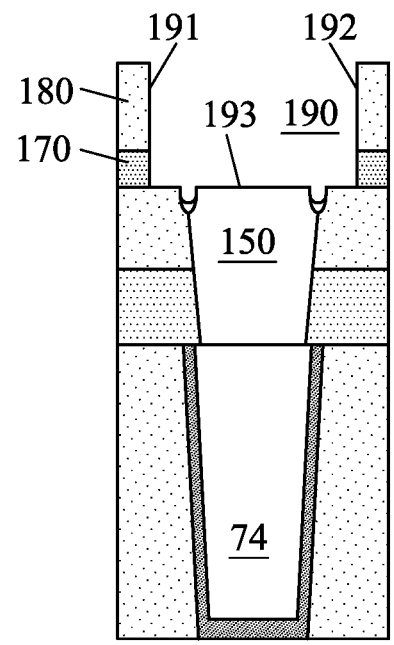

At operation 1135, method 1100 includes etching the dielectric layer and etch stop layer to form a cavity overlying the conductive structure. As shown in FIG. 10, cavity 190 is formed over conductive structure 150.

Operation 1135 may include forming a film stack (not shown) over the IMD layer 180. Such a film stack may be used to form metallization lines and vias that are electrically connected to conductive structure 150 and conductive lines. The film stack may include a buffer layer and a mask layer. In some embodiments, the film stack includes more than one buffer layer and mask layer, which may be formed in alternating fashion. The buffer layers and the mask layers may be formed of similar materials and by similar processes as described above in connection with the buffer layer and the mask layer. Openings are formed in the mask layer, and the openings are extended through the buffer layer, the IMD layer 180, and the etch stop layer 170 to form cavity 190. The openings may be formed and extended by the acceptable etching techniques and etchants described above in connection with openings 130. The cavity 190 exposes the underlying conductive structure 150. The etch stop layer 170 may be removed using an anisotropic wet or dry etch that is selective to the material of the etch stop layer 170. For example, the etch stop layer 170 may be removed using a dry etch. The etching process used to remove the etch stop layer 170 may be different from the etching processes used to form the openings 130 (e.g., different etchants and/or other etching process parameters may be used).

As shown in FIG. 10, the cavity 190 is bordered by cavity sidewalls 191 and 192 and by cavity bottom 193. Cavity sidewalls 191 and 192 are formed by the etch stop layer 170 and the dielectric layer 180. Cavity bottom 193 is formed by dielectric layer 180, conductive structure 150, and a portion of the etch stop layer 170 remaining in pockets 165 and 166.

Figure 11:
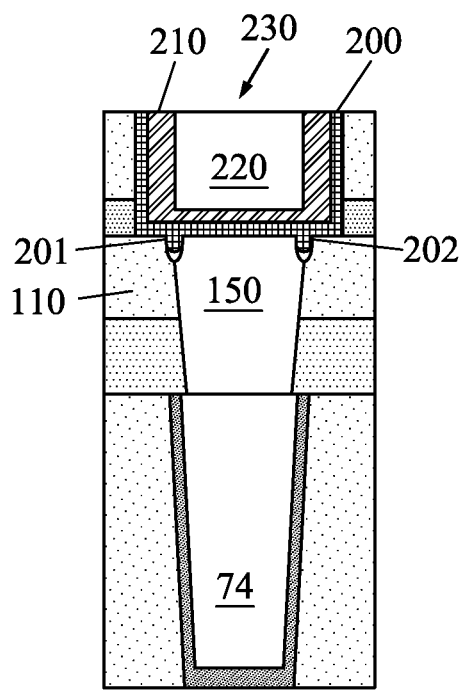

Method 1100 continues at operation 1136 with forming a barrier material over the conductive structure. For example, the barrier material is formed on the exposed surface of the wafer and in the cavity 190. As shown in FIG. 11, a layer of barrier material 200 is deposited over the structure of FIG. 10, including in cavity 190. The barrier material 200 fills the remainder of the pockets 165 and 166. Thus, operation 1136 includes locating a barrier material 200 between the dielectric material 110 and the upper portion of each sidewall 151 and 152 of conductive structure 150. In exemplary embodiments, the barrier material 200 is TiN or TaN.

The layer of barrier material 200 may be formed by a PVD process, ALD process, or a combination thereof. In some exemplary deposition process, Ar is introduced into the respective deposition chamber (not shown), in which wafer 50 is placed, to sputter metal ions (such as titanium (Ti+) or tantalum (Ta+)) or atoms without charges (such as titanium (Ti) or tantalum (Ta)) from the respective target (not shown) used in the PVD. Nitrogen may be added into the process gases. The sputtered metal ions are deposited onto wafer 50, forming the layer of barrier material 200, which is conductive. In the deposition of the barrier material 200, a DC power and/or a radio frequency (RF) power may be applied. After deposition, the barrier material 200 covers the cavity sidewalls and cavity bottom. Specifically, portions of the barrier material 200 are located directly on the top surface 154 of the conductive structure 150, on the sidewalls of the conductive structure 150 in the pockets 165 and 166, on the etch stop layer 170 in the pockets 165 and 166, on the sidewalls of the dielectric layer 110 in the pockets 165 and 166, on the top surface 114 of the dielectric layer 110, and on the cavity sidewall 191 and 192 formed by the etch stop layer 170 and the dielectric layer 180.

Method 1100 continues at operation 1137 with forming a liner over the barrier material. As shown in FIG. 11, a liner 210 is deposited over the barrier material 200, including in cavity 190. An exemplary liner 210 is cobalt, though the liner may be formed from ruthenium, molybdenum, rhodium, or the like In the method 1100, the liner 210 is formed on the exposed surface of the wafer and in the cavity 190. The liner 210 may be formed by a deposition process such as CVD, PVD, ALD, the like, or a combination thereof. In accordance with some embodiments, the liner 210 may be formed with a CVD process by flowing a molecule containing cobalt attached to one or more alkyl groups, one or more carbonyl groups, one or more other functional groups, or combinations thereof.

Method 1100 may continue with operation 1138 in which conductive material is deposited over the liner. In the method 1100, conductive material or fill 220 is formed on the exposed surface of the wafer and in the cavity 190. An exemplary conductive material 220 is a metallic material, including a metal or a metal alloy such as copper, silver, gold, tungsten, cobalt, aluminum, or alloys thereof. In exemplary embodiments, the conductive material 220 is copper.

In FIG. 11, conductive material 220 fills the remainder of cavity 190 over liner 210. Excess conductive material 220 may also be formed along top surface of the liner 210. In some embodiments, the formation of the conductive material 220 includes depositing a thin seed layer (not shown), which may include copper or a copper alloy, and filling the rest of the openings 130 using CVD, PVD, ALD, ECP, such as high voltage ECP, or electro-less plating.

In accordance with some embodiments, a deposition method, such as PVD, may be used to form the conductive material 220 in cavity 190. For example, a first deposition of copper may be performed at room temperature, which may be followed by a reflow process at about 150° C. to about 300° C. for about 1 minute to about 5 minutes. One or more depositions of copper and reflow processes may follow the first cycle. In total, there may be one to five, or more, alternating cycles of depositions and reflow processes.

In FIG. 11, a planarization process may be performed to remove excess of the conductive material 220, the liner 210, and the barrier material 200, thereby forming conductive structure 230 in cavity 190. In addition, the planarization process may remove remaining portions of the mask layers and the buffer layers, thereby exposing the IMD layer 180. The planarization process may be a grinding or a CMP, and may be performed such that the top surfaces of the conductive material 220, liner 210, barrier material 200, and the IMD layer 180 are level or are substantially level. The conductive structure 230 includes remaining portions of the conductive material 220, liner 210, and barrier material 200, The conductive structure 230 is, therefore, physically and electrically connected to the underlying conductive structure 74. Conductive structure 230 may be considered to be an upper conductive structure 230, and underlying conductive structure 74 may be considered to be an intermediate conductive structure 74, or a lower conductive structure 74 with respect to upper conductive structure 230.

Method 1100 may continue with operation 1139 in which further processing of the structure of FIG. 11 is performed. For example, a capping layer may be deposited and patterned over the structure of FIG. 11. Further, additional metallization and dielectric layers and conductive vias may be formed using similar materials and similar processes as described above. In addition, one or more steps of forming additional metallization lines with the conductive vias may be performed using different materials and/or processes as compared with earlier described processing.

As shown, the structure of FIG. 11 provides for the electrical interconnection of an upper conductive structure 230 to a lower conductive structure 150 that lies over and is electrically interconnected to conductive structure 74, such that lower conductive structure 150 passes through dielectric layer 110 and etch stop layer 108.

Figure 12:
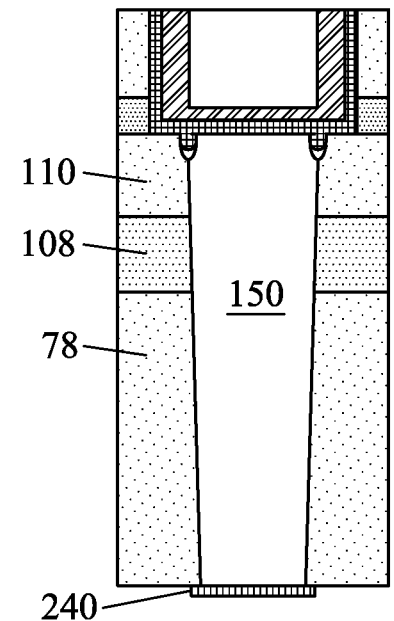
FIG. 12 is a focused cross-sectional view of an alternative interconnect structure similar to the structure of FIG. 11, in accordance with some embodiments.

Alternatively, as indicated by FIG. 12 cross-referenced with FIGS. 3-6, the lower conductive structure 150 may be electrically interconnected to an underlying structure 240 such as a silicide layer over a source/drain region 54 or a gate 68. Thus, lower conductive structure 150 may extend through dielectric layer 110, etch stop layer 108, dielectric layer 78, and possibly lower layers.

Regardless of the lower interconnection design, in the structures of FIGS. 7-11 and 12 and in method 1100 of FIG. 1, locating barrier material 200 in the pockets to form downward projections 201 and 202 helps to interconnect conductive structures in a device with a higher yield and with greater performance reliability. In such embodiments of an interconnection between a lower conductive structure 150 and an upper conductive structure 230 (relative to one another), the lower conductive structure 150 includes a top surface 154 that is covered with the barrier material 200. Further, the top surface 154 of the lower conductive structure 150 is surrounded at the sides or lateral edges by the barrier material 200. Specifically, downward projections 201 and 202 of the upper conductive structure 230 surround the top surface 154 of the conductive structure 150. Thus, diffusion of metals into surrounding material is prevented or reduced due to the increased contact area between the barrier material 200 and the lower conductive structure 150, due to the contact therebetween along top surface 154 and along the upper portion of sidewalls 151 and 152.

Figure 13:
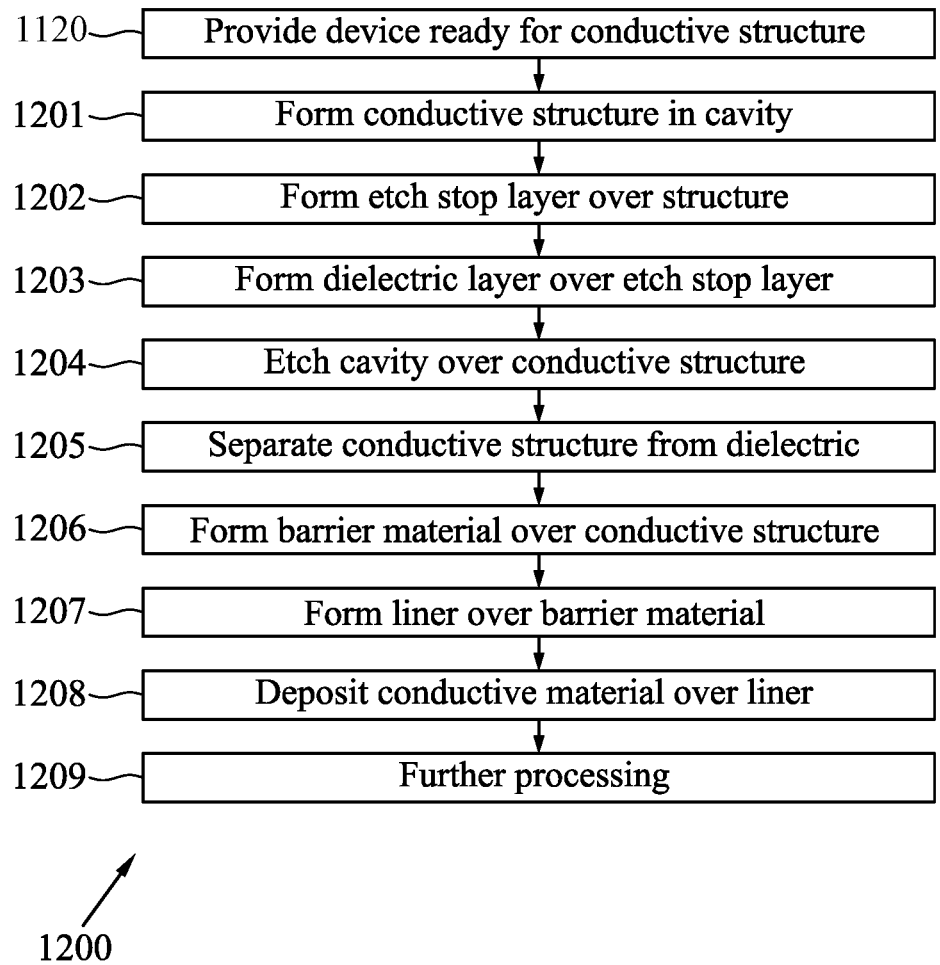
FIG. 13 is a flow chart illustrating a method for forming a semiconductor device including an interconnection between conductive structures, in accordance with some embodiments.

Referring now to FIG. 13, another embodiment of a method 1200 is provided for forming a semiconductor device including an interconnection between conductive structures, in accordance with some embodiments.

FIG. 13 is a flow chart described in conjunction with FIGS. 3-6, which illustrate a semiconductor device 40 at various stages of fabrication in accordance with some embodiments of the present disclosure of the method 1200, and with FIGS. 14-17, which illustrate cross-sectional views of intermediate stages in the formation of conductive features and interconnect structures of semiconductor devices, in accordance with some embodiments. While the Figures may illustrate formation of conductive lines and/or a metallization layer (including metallization lines and conductive vias) of an interconnect structure using a single damascene process, dual damascene processes are also contemplated.

As shown in FIG. 13, method 1200 includes process 1120 for providing a semiconductor device 40 ready for formation of a conductive structure (as described above in relation to FIG. 1 and FIGS. 3-6). After completion of process 1120, formation of the conductive structure may begin.

Operation 1201 of method 1200 includes forming conductive structures in the cavities. For example, FIG. 14 is a focused view of a selected lower conductive structure 74 of FIG. 6 during further processing, such as during so-called back end-of-line (BEOL) processing for forming conductive features of a second or intermediate interconnect level (formed subsequently) using conductive connectors (e.g., intermediate contact structures or plugs 150) formed through the intervening dielectric layers. It is noted that FIG. 14 illustrates the lower conductive structure 74 includes a liner or barrier layer 75.

As shown, in method 1200, operation 1201 includes first forming a liner 148 in cavity 140. Liner 148 may be an adhesion layer for enhancing adhesion of the later deposited conductive material to the cavity and/or may include barrier metals used to reduce out-diffusion of conductive materials from the conductive structure 150 into the surrounding dielectric materials. Liner 148 may be formed according to the description above related to the lower metallization layer. In certain embodiments, the liner 148 may be TaN or TaN.

Further, operation 1201 includes forming a conductive material 149 over the liner 148. As shown, a conductive material 149 is deposited in the cavity 140. Conductive material 149 and liner 148 are planarized to form intermediate conductive structure 150 with a top surface 154 co-planar with a top surface 114 of the dielectric material 110. In the illustrated embodiments, the liner 148 of the conductive structure 150 is formed in direct contact with the surrounding dielectric 110 and surrounding contact etch stop layer 108.

As shown in FIG. 14, the conductive structure 150 has a first sidewall 151 and a second sidewall 152 that each extend from a bottom surface 153 to a top surface 154. The bottom surface 153 in conductive contact with the underlying conductive structure 74.

In the illustrated embodiment, each sidewall 151 and 152 is in direct contact with the etch stop layer 108 and the dielectric layer 110 along a respective interface 161, 162. Specifically, a lower portion 155 of each sidewall 151, 152 is in direct contact with the etch stop layer 108, and an upper portion 156 of each sidewall 151, 152 is in direct contact with the dielectric layer 110. As shown, each sidewall 151, 152 intersects the top surface 154 at a respective joint or corner 157, 158, each of which is illustrated as an angular edge but may be rounded.

Method 1200 continues with operation 1202 with forming an etch stop layer over the structure of FIG. 14. As shown in FIG. 15, an etch stop layer 170 is formed over the dielectric layer 110 and the conductive structure 150. The etch stop layer 170 may be formed of similar materials and by a similar process as described above in connection with method 1100.

Method 1200 continues at operation 1203 with forming a dielectric layer over the etch stop layer 170. As shown in FIG. 15, a dielectric layer 180, such as an IMD layer, is formed over the etch stop layer 170. Dielectric layer 180 may be formed of similar materials and by a similar process as described above.

At operation 1204, method 1100 includes etching the dielectric layer and etch stop layer to form a cavity overlying the conductive structure. As shown in FIG. 16, cavity 190 is formed over conductive structure 150.

Operation 1204 may include forming a film stack (not shown), patterning the film stack and extending openings patterned in the film stack through the IMD layer 180, and the etch stop layer 170 to form cavity 190, as described above. The cavity 190 exposes the underlying conductive structure 150. The etch stop layer 170 may be removed using an anisotropic wet or dry etch that is selective to the material of the etch stop layer 170. In an exemplary embodiment, a dry etch that is selective to etching the etch stop layer 170 as compared to etching the dielectric material 110.

Method 1200 further includes operation 1205, in which the conductive structure is separated from the dielectric. In method 1200, operation 1205 may be performed concurrently with operation 1204. Specifically, etching etch stop layer 170 may include etching an upper portion of liner 148 of conductive structure 150. In certain embodiments, a portion of conductive material 149 may be etched along sidewalls as well. Thus, upper portions of sidewalls 151 and 152 are recessed away from the surrounding dielectric material 110. As a result, pockets or voids 165 and 166 are formed between the recessed sidewalls 151 and 152 of the conductive structure 150 and the surrounding dielectric material 110. As shown, each pocket 165, 166 extends downwardly from the top surface 154.

As shown in FIG. 16, the cavity 190 is bordered by cavity sidewalls 191 and 192 and by cavity bottom 193. Cavity sidewalls 191 and 192 are formed by the etch stop layer 170 and the dielectric layer 180. Cavity bottom 193 is formed by dielectric layer 110, exposed portions of sidewalls 151 and 152 of conductive structure 150 in pockets 165 and 166, and the top surface 154 of conductive structure 150.

Method 1100 continues at operation 1206 with forming a barrier material over the conductive structure. For example, the barrier material is formed on the exposed surface of the wafer and in the cavity 190. As shown in FIG. 17, a layer of barrier material 200 is deposited over the structure of FIG. 16, including in cavity 190. The barrier material 200 fills the remainder of the pockets 165 and 166. Thus, operation 1136 includes locating a barrier material 200 between the dielectric material 110 and the upper portion of each sidewall 151 and 152 of conductive structure 150. In exemplary embodiments, the barrier material 200 is TiN or TaN.

The layer of barrier material 200 may be formed as described above in relation to method 1100. After deposition, the barrier material 200 covers the cavity sidewalls and cavity bottom. Specifically, portions of the barrier material 200 are located directly on the top surface 154 of the conductive structure 150, on the sidewalls of the conductive structure 150 in the pockets 165 and 166, on the liner 148 in the pockets 165 and 166, on the sidewalls of the dielectric layer 110 in the pockets 165 and 166, on the top surface 114 of the dielectric layer 110, and on the cavity sidewall 191 and 192 formed by the etch stop layer 170 and the dielectric layer 180.

Method 1200 continues at operation 1207 with forming a liner over the barrier material. As shown in FIG. 17, a liner 210 is deposited over the barrier material 200, including in cavity 190. An exemplary liner 210 is cobalt, though the liner may be formed from ruthenium, molybdenum, rhodium, or the like.

In method 1200, the liner 210 is formed on the exposed surface of the wafer and in the cavity 190. The liner 210 may be formed by a deposition process such as CVD, PVD, ALD, the like, or a combination thereof. In accordance with some embodiments, the liner 210 may be formed with a CVD process by flowing a molecule containing cobalt attached to one or more alkyl groups, one or more carbonyl groups, one or more other functional groups, or combinations thereof.

Method 1200 may continue with operation 1208 in which conductive material is deposited over the liner. In the method 1200, conductive material 220 is formed on the exposed surface of the wafer and in the cavity 190. An exemplary conductive material 220 is a metallic material, including a metal or a metal alloy such as copper, silver, gold, tungsten, cobalt, aluminum, or alloys thereof. In exemplary embodiments, the conductive material 220 is copper.

In FIG. 17, conductive material 220 fills the remainder of cavity 190 over liner 210. Excess conductive material 220 may also be formed along top surface of the liner 210. In some embodiments, the formation of the conductive material 220 includes depositing a thin seed layer (not shown), which may include copper or a copper alloy, and filling the rest of the openings 130 using CVD, PVD, ALD, ECP, such as high voltage ECP, or electro-less plating.

In accordance with some embodiments, a deposition method, such as PVD, may be used to form the conductive material 220 in cavity 190. For example, a first deposition of copper may be performed at room temperature, which may be followed by a reflow process at about 150° C. to about 300° C. for about 1 minute to about 5 minutes. One or more depositions of copper and reflow processes may follow the first cycle. In total, there may be one to five, or more, alternating cycles of depositions and reflow processes.

In FIG. 17, a planarization process may be performed to remove excess of the conductive material 220, the liner 210, and the barrier material 200, thereby forming conductive structure 230 in cavity 190. In addition, the planarization process may remove remaining portions of the mask layers and the buffer layers, thereby exposing the IMD layer 180. The planarization process may be a grinding or a CMP, and may be performed such that the top surfaces of the conductive material 220, liner 210, barrier material 200, and the IMD layer 180 are level or are substantially level. The conductive structure 230 includes remaining portions of the conductive material 220, liner 210, and barrier material 200. The conductive structure 230 is, therefore, physically and electrically connected to the underlying conductive structure 74. Conductive structure 230 may be considered to be an upper conductive structure 230, and underlying conductive structure 74 may be considered to be an intermediate conductive structure 74, or a lower conductive structure 74 with respect to upper conductive structure 230.

Method 1200 may continue with operation 1209 in which further processing of the structure of FIG. 17 is performed. For example, a capping layer may be deposited and patterned over the structure of FIG. 17. Further, additional metallization and dielectric layers and conductive vias may be formed using similar materials and similar processes as described above. In addition, one or more steps of forming additional metallization lines with the conductive vias may be performed using different materials and/or processes as compared with earlier described processing.

As shown, the structure of FIG. 17 provides for the electrical interconnection of an upper conductive structure 230 to a lower conductive structure 150 that lies over and is electrically interconnected to conductive structure 74, such that lower conductive structure 150 pass through dielectric layer 110 and etch stop layer 108.

Alternatively, as indicated by FIG. 18 cross-referenced with FIGS. 3-6, the lower conductive structure 150 may be electrically interconnected to an underlying structure 240 such as a silicide layer over a source/drain region 54 or a gate 68. Thus, lower conductive structure 150 may extend through dielectric layer 110, etch stop layer 108, dielectric layer 78, and possibly lower layers.

Regardless of the lower interconnection design, in the structures of FIGS. 13-17 and 18 and in method 1200 of FIG. 13, locating barrier material 200 in the pockets to form downward projections 201 and 202 helps to interconnect conductive structures in a device with a higher yield and with greater performance reliability. In such embodiments of an interconnection between a lower conductive structure 150 and an upper conductive structure 230 (relative to one another), the lower conductive structure 150 includes a top surface 154 that is covered with the barrier material 200. Further, the top surface 154 of the lower conductive structure 150 is surrounded at the sides or lateral edges by the barrier material 200. Specifically, downward projections 201 and 202 of the upper conductive structure 230 surround the top surface 154 of the conductive structure 150. Thus, diffusion of metals into surrounding material is prevented or reduced due to the increased contact area between the barrier material 200 and the lower conductive structure 150, due to the contact therebetween along top surface 154 and along the upper portion of sidewalls 151 and 152.

Figure 19:
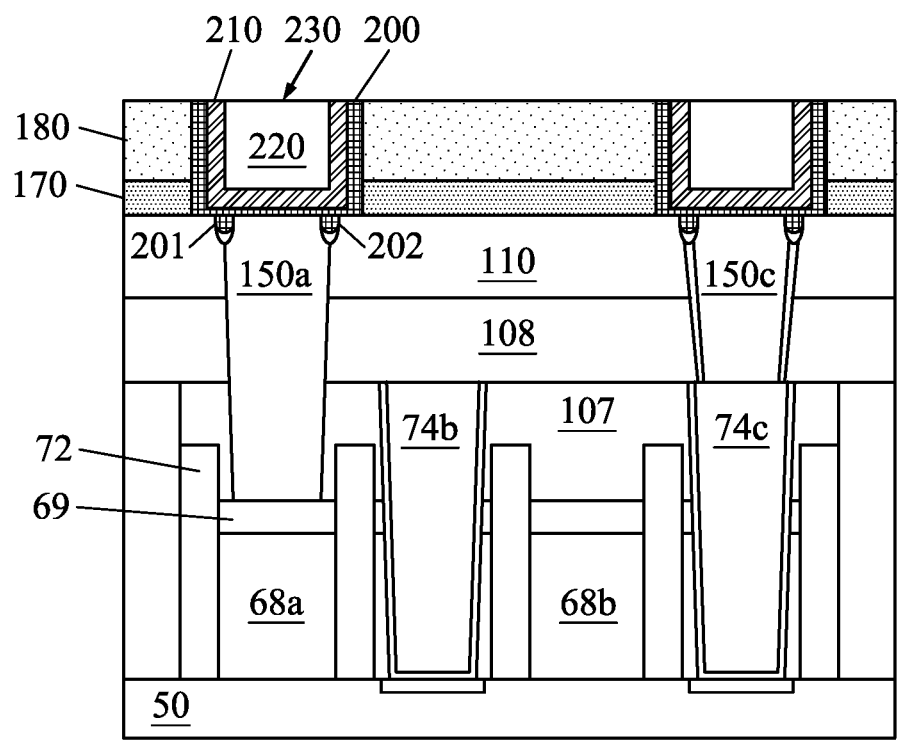
FIG. 19 is a cross-sectional view illustrating two interconnect structures and components therebetween.
Figure 20:
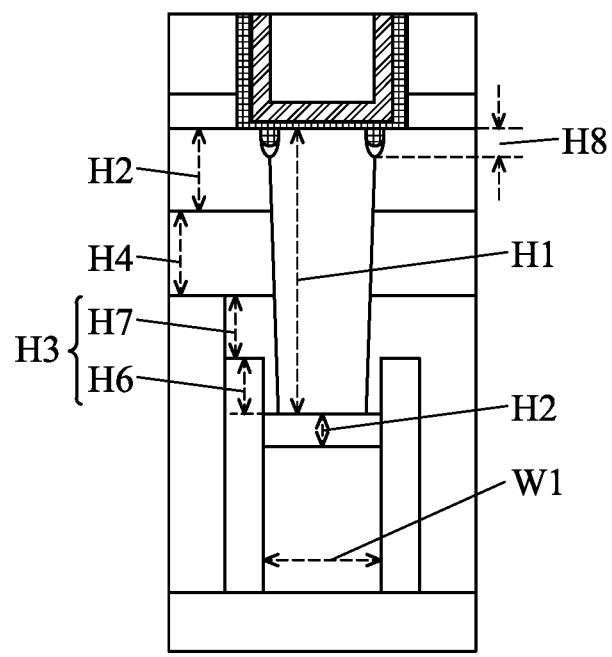
FIG. 20 is a cross-sectional view of a focused portion of FIG. 18 illustrating various dimensions, in accordance with some embodiments.

FIG. 19 provides a more comprehensive view of multiple electrical interconnections in an exemplary semiconductor device 40. FIG. 20 illustrates various dimensions of components in FIG. 19.

As shown in FIG. 19, a dielectric layer 180 lies over etch stop layer 170; etch stop layer 170 lies over dielectric layer 110; dielectric layer 110 lies over etch stop layer 108; etch stop layer 108 lies over SAC layer 107 in which gate structures 68a and 68b are formed; and SAC layer 107 lies over substrate 50, in which various other structures or devices may be formed. Each dielectric layer, etch stop layer, and SAC layer may be selected from LaO, AlO, YO, TaCN, ZrSi, SiOCN, SiOC, SiCN, LaO, ZrN, ZrAlO, TiO, TaO, ZrO, HfO, SiN, HfSi, AlON, SiO, SiC, and/or ZnO.

In FIG. 19, a first conductive structure 150a and a second conductive structure 150c are formed over a substrate 50 (including underlying structures formed thereon). Exemplary first and second conductive structures 150a and 150c are or include a metal or metals selected from W, Ru, Al, Mo, Ti, TiN, TiSi, CoSi, NiSi, Cu, TaN, and/or Co. An exemplary first conductive structure 150a has a height H1 of from 5 to 80 nanometers (nm).

Exemplary conductive structures 150 may or may not include a liner 148. As shown, second conductive structure 150c includes a liner 148. An exemplary liner 148 is selected from Co, W, Ru, Al, Mo, Ti, TiN, TiSi, CoSi, NiSi, Cu, TaN, TiO, ZnO, and AlO. An exemplary liner 148 has a thickness of from 1 to 30 Angstrom (Å). Exemplary second conductive structure 150c extends through dielectric material 110 and etch stop layer 108 to contact underlying conductive structure 74c.

As shown, first conductive structure 150a extends through dielectric material 110, etch stop layer 108, and SAC material 107, to contact a gate structure 68, and specifically to contact a gate cap 69 of the gate structure 68.

An exemplary gate cap 69 is selected from tungsten, cobalt, ruthenium, and/or titanium nitride. An exemplary gate cap 69 has a thickness H2 of from 1 to 10 nm. An exemplary gate structure 68 has a width W1 of from 2 to 50 nm.

An exemplary SAC material 107 has a height H3, over the underlying gate structure 68, including gate cap 69, of from 1 to 50 nm.

An exemplary etch stop layer 108 has a thickness H4 of from 3 to 40 nm.

An exemplary dielectric material 110 has a height H5 of from 3 to 50 nm.

As shown, spacers 72 surround gate structure 68. Exemplary spacers 72 may have a height H6 of 0 to 50 nm. Further, spacers 72 may be distanced from overlying etch stop layer 108 by a distance H7 of from 0 to 30 nm. It is noted that H6 and H7 cannot both be 0 nm in a same embodiment, i.e., H3 cannot be 0 nm.

In FIG. 19, each conductive structure 230 includes a layer of barrier material 200, a liner 210, and a conductive material 220.

An exemplary barrier material 200 is selected from Co, W, Ru, Al, Mo, Ti, TiN, TiSi, CoSi, NiSi, Cu, and/or TaN. An exemplary barrier material 200 has a sidewall thickness and a bottom thickness, independently, of from 1 to 30 Angstrom (Å).

An exemplary liner 210 is selected from Co, W, Ru, Al, Mo, Ti, TiN, TiSi, CoSi, NiSi, Cu, and/or TaN. An exemplary liner 210 has a thickness of from 0 to 30 Å, such as from 1 to 30 Å. In other words, the conductive structure 230 may not include liner 210.

An exemplary conductive fill material 220 is selected from W, Ru, Al, Mo, Ti, TiN, TiSi, CoSi, NiSi, Cu, TaN, and/or Co.

As shown, projections 201 and 202 extend downward from the top surface of the conductive structures 150a and 150c by a height H8. In exemplary embodiments, the projections 201 and 202 may be considered to be formed only by the barrier material 200, in other exemplary embodiments, the projections 201 and 202 may be considered to be formed by the barrier material 200 and the etch stop layer 170 in the pockets. In exemplary embodiments, height H8 is from 0.5 to 10 nm.

Figure 21:
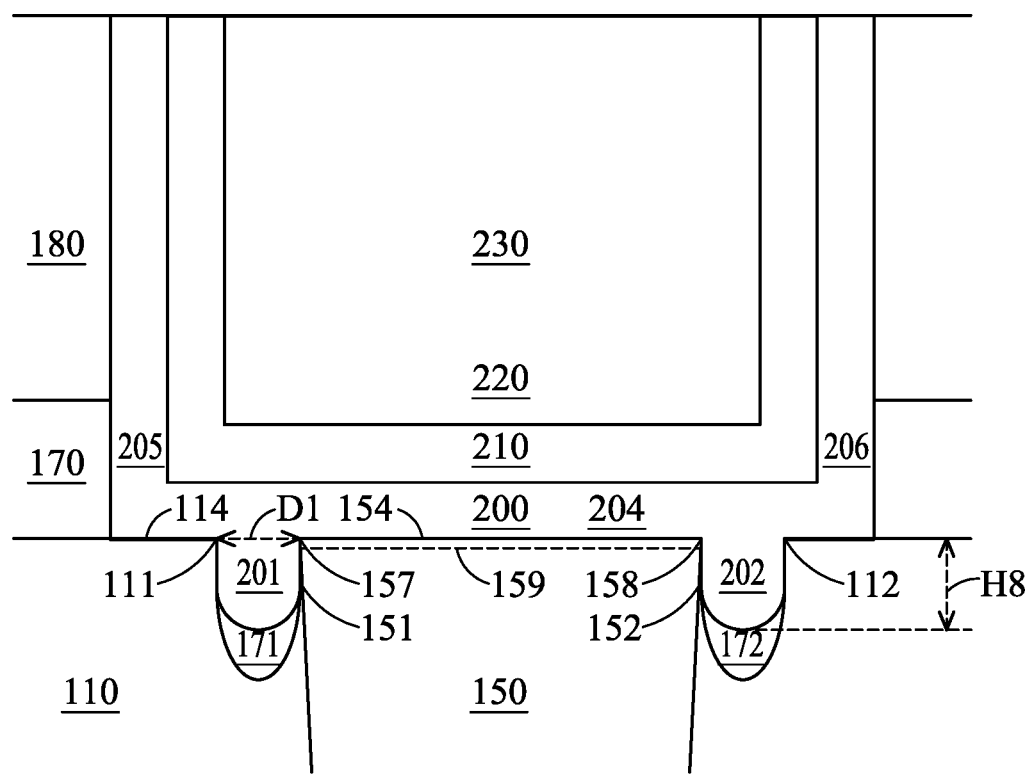
FIG. 21 is a cross-sectional view of a focused portion of FIG. 19 illustrating features of the barrier material, in accordance with some embodiments.

Referring now to FIG. 21, features of the barrier material 200 and relationships with other features are described. As shown, the barrier material 200 includes downward projections 201 and 202. FIG. 21 indicates that the projections 201 and 202 terminate at the lowest portion of the barrier material 200, i.e., that the projections 201 and 202 do not include the portions 171 and 172 of etch stop layer 170 located in the pockets. In other embodiments, etch stop layer portions 171 and 172 may be considered to be part of the projections 201 and 202.

Downward projections 201 and 202 are interconnected by a laterally, or horizontally, extending lateral bridge 204. Lateral bridge 204 extends from a first upward-extending sidewall 205 to a second upward-extending sidewall 206. In certain embodiments, the lateral bridge 204 terminates at the first upward-extending sidewall 205 and terminates at the second upward-extending sidewall 206.

As shown in FIG. 21, the top surface 154 of the conductive structure 150 extends between and terminates at upper joints or corners 157 and 158, where respective sidewalls 151, 152 intersect the top surface 154. Corner 157 is separated from, i.e., distanced from, a nearest portion 111 of dielectric material 110. Corner 158 is separated from, i.e., distanced from, a nearest portion 112 of dielectric material 110. A minimum distance D1 is established between each corner 157, 158 and the respective nearest portion 111, 112 of dielectric material 110. In exemplary embodiments, the minimum distance D1 exists along a lateral or horizontal direction with respect to the substrate. In exemplary embodiments, the minimum distance D1 is from 0.5 to 10 nm.

In exemplary embodiments, the lower conductive structure 150 is formed from grains. A top grain boundary 159 is defined at a distance from top surface 154 of the lower contact structure 150. For example, a monolayer of grains may be located between the top surface 154 and the top grain boundary 159. As shown in FIG. 21, the top grain boundary 159 is located above the depth of the projections 201 and 202, i.e., the depth of the top grain boundary 159 is less than the height H8 of the projections 201 and 202. In an exemplary embodiment, the top grain boundary 159 of the conductive structure 150 is less than 0.5 to 10 nm from the top surface 154, such as less than 0.5 nm from the top surface 154.

A method is provided in accordance with some embodiments. The method includes forming a lower conductive contact in a dielectric material and over a structure, wherein the lower conductive contact has opposite sidewalls that extend to and terminate at a top surface; separating an upper portion of each sidewall from the dielectric material; locating a barrier material between the upper portion of each sidewall and the dielectric material; and forming an upper conductive contact over the lower conductive contact.

In certain embodiments, the barrier material is or includes a metal nitride.

In certain embodiments of the method, forming the upper conductive contact over the lower conductive contact includes: forming a dielectric layer over the lower conductive contact; etching the dielectric layer to form a cavity overlying the lower conductive contact, wherein the cavity is bordered by cavity sidewalls and a cavity bottom; and depositing the barrier material over the cavity sidewalls and cavity bottom; wherein locating the barrier material between the upper portion of each sidewall and the dielectric material includes depositing the barrier material over the cavity sidewalls and the cavity bottom. In such embodiments, forming the upper conductive contact over the lower conductive contact further includes depositing a liner over the barrier material; and depositing a metal over the liner. Further, in such embodiments, the lower conductive contact may be ruthenium; the barrier material is or includes a metal nitride; the liner is or includes cobalt; and the metal is or includes copper.

In certain embodiments, the method further includes locating an etch stop material between the upper portion of each sidewall and the dielectric material, wherein the barrier material is located overlying the etch stop material.

In certain embodiments of the method, separating the upper portion of each sidewall from the dielectric material includes etching the dielectric material or etching the dielectric material and the lower conductive contact.

In certain embodiments of the method, separating the upper portion of each sidewall from the dielectric material includes performing a chemical mechanical planarization process on the top surface of the lower conductive contact.

In certain embodiments of the method, an adhesion layer is located between the lower conductive contact and the dielectric material, and separating the upper portion of each sidewall from the dielectric material comprises etching the adhesion layer; etching the adhesion layer and the dielectric material; or etching the adhesion layer, the dielectric material and the lower conductive contact.

A method is provided in accordance with other embodiments and includes forming a conductive structure over a substrate, wherein the conductive structure has a first sidewall intersecting a top surface at a first joint, and a second sidewall intersecting the top surface at a second joint; forming a first pocket adjacent to the first sidewall and a second pocket adjacent to the second sidewall, wherein each pocket extends downwardly from the top surface; and forming a barrier layer over the conductive structure, wherein the barrier layer includes a first projection extending downward along the first sidewall into the first pocket, a second projection extending downward along the second sidewall into the second pocket, and a lateral bridge portion over the top surface and interconnecting the first projection and the second projection.

In certain embodiments of the method, forming the conductive structure over the substrate includes forming the conductive structure in a dielectric material, and forming the first pocket and the second pocket includes removing a portion of the first sidewall of the conductive structure and a portion of the second sidewall of the conductive structure and/or removing a portion of the dielectric material adjacent to the first sidewall and the second sidewall.

In certain embodiments of the method, forming the conductive structure over the substrate includes forming the conductive structure in a dielectric material and planarizing the dielectric material and the conductive structure to a top surface of the dielectric material and the top surface of the conductive structure; and the method further includes forming an etch stop layer over the top surface of the dielectric material and the top surface of the conductive structure and within the first pocket and the second pocket. In such embodiments, planarizing the dielectric material and the conductive structure to the top surface of the dielectric material and the top surface of the conductive structure includes forming the first pocket adjacent to the first sidewall and the second pocket adjacent to the second sidewall.

In certain embodiments of the method, forming the conductive structure over the substrate includes: forming a cavity in a dielectric material; forming an adhesion layer over the cavity; and depositing conductive material over the adhesion layer in the cavity; and the method further includes: forming an etch stop layer over the dielectric material and the conductive structure; forming a dielectric layer over the etch stop layer; and performing an etch process to form an opening over the conductive structure, wherein the etch process forms the first pocket and the second pocket.

A device is provided in accordance with some embodiments. The device includes a conductive structure overlying a substrate, wherein the conductive structure has a top surface, a first sidewall intersecting the top surface at a first joint, and a second sidewall intersecting the top surface at a second joint; and a barrier layer over the conductive structure, wherein the barrier layer includes a first projection extending downward along the first sidewall, a second projection extending downward along the second sidewall, and a lateral bridge over the top surface, wherein the lateral bridge interconnects the first projection and the second projection.

In certain embodiments of the device, the conductive structure is formed with crystallographic grains and includes a top grain boundary; the top grain boundary is located at a boundary depth below the top surface; the first projection extends to a first depth greater than the boundary depth; and the second projection extends to a second depth greater than the boundary depth.

In certain embodiments, the device includes a dielectric material overlying an etch stop layer, wherein the conductive structure is located in the dielectric material and etch stop layer, wherein the first joint and the second joint are each distanced from the dielectric material by a minimum distance, and wherein the minimum distance extends in a horizontal direction.

In certain embodiments, the device further includes a dielectric material overlying an etch stop layer, wherein the conductive structure is located in the dielectric material and etch stop layer, and wherein a lower portion of the conductive structure is in direct contact with the dielectric material or the etch stop layer, or is separated from the dielectric material or the etch stop layer by a thickness of less than 30 Å.

In certain embodiments of the device, the lateral bridge extends beyond the first projection to a first wall extending upward; the lateral bridge extends beyond the second projection to a second wall extending upward; and the device further includes a conductive contact located over the lateral bridge and between the first wall and the second wall.

In certain embodiments, the device further includes a conductive contact located over the lateral bridge of the barrier layer; and a liner between the conductive contact and the barrier layer, and the conductive structure includes ruthenium; the barrier layer includes a metal nitride; the liner includes cobalt; and the conductive contact includes copper.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present.

What is claimed is:

1. A method, comprising:
   forming a lower conductive contact in a dielectric material and over a structure, wherein the lower conductive contact has a sidewall that extends to and terminates at a top surface, wherein the lower conductive contact is comprised of grains and includes a top grain boundary, and wherein the top grain boundary is located at a boundary depth below the top surface;
   separating an upper portion of the sidewall from the dielectric material;
   locating a barrier material between the upper portion of the sidewall and the dielectric material, wherein the barrier material includes a projection extending downward along the sidewall to a projection depth greater than the boundary depth; and
   forming an upper conductive contact over the lower conductive contact.

2. The method of claim 1, wherein the barrier material comprises a metal nitride.

3. The method of claim 1, further comprising locating an etch stop material between the upper portion of the sidewall and the dielectric material, wherein the barrier material is located overlying the etch stop material.

4. The method of claim 1, wherein separating the upper portion of the sidewall from the dielectric material comprises etching the dielectric material or etching a portion of a sidewall of the dielectric material and the conductive contact.

5. The method of claim 1, wherein separating the upper portion of the sidewall from the dielectric material comprises performing a chemical mechanical planarization process on the top surface of the lower conductive contact.

6. The method of claim 1, wherein an adhesion layer is located between the lower conductive contact and the dielectric material, and wherein separating the upper portion of the sidewall from the dielectric material comprises etching the adhesion layer; etching the adhesion layer and the dielectric material; or etching the adhesion layer, the dielectric material and the lower conductive contact.

7. The method of claim 1, wherein:
   the sidewall is a first sidewall, and wherein the lower conductive contact has a second sidewall that extends to and terminates at the top surface;
   separating an upper portion of the sidewall from the dielectric material comprises separating an upper portion of each sidewall from the dielectric material;
   locating the barrier material between the upper portion of the sidewall and the dielectric material comprises locating the barrier material between the upper portion of each sidewall and the dielectric material;
   the projection is a first projection extending downward along the first sidewall to a first projection depth greater than the boundary depth; and
   the barrier material includes a second projection extending downward along the second sidewall to a second projection depth greater than the boundary depth.

8. The method of claim 7, wherein the barrier material includes a lateral bridge over the top surface, and wherein the lateral bridge interconnects the first projection and the second projection.

9. The method of claim 8, wherein
   the lateral bridge extends beyond the first projection to a first wall extending upward;
   the lateral bridge extends beyond the second projection to a second wall extending upward;
   the upper conductive contact is located over the lateral bridge and between the first wall and the second wall.

10. The method of claim 7, wherein the first sidewall intersects the top surface at a first joint and the second sidewall intersects the top surface at a second joint;
    wherein forming the upper conductive contact over the lower conductive contact comprises:
    forming a dielectric layer over the lower conductive contact;
    etching the dielectric layer to form a cavity overlying the lower conductive contact, wherein the cavity is bordered by cavity sidewalls and a cavity bottom; and
    depositing the barrier material over the cavity sidewalls and cavity bottom; wherein locating the barrier material between the upper portion of each sidewall and the dielectric material comprises depositing the barrier material over the cavity sidewalls and the cavity bottom; and wherein:
    the first joint and the second joint are each distanced from the dielectric material by a minimum distance extending in a horizontal direction; and
    a lower portion of the lower conductive contact is in direct contact with the dielectric material, or is separated from the dielectric material by a thickness of less than 30 Angstrom (Å).

11. The method of claim 1, further comprising forming a liner between the upper conductive contact and the barrier material, wherein the lower conductive contact comprises ruthenium, the barrier material comprises a metal nitride, the liner comprises cobalt, and the upper conductive contact comprises copper.

12. The method of claim 1, further comprising locating an etch stop layer between the upper portion of the sidewall and the dielectric material before locating the barrier material between the upper portion of the sidewall and the dielectric material, wherein a portion of the etch stop layer is located below the projection.

13. A method, comprising:
    forming a lower conductive contact in a dielectric material and over a structure, wherein the lower conductive contact has opposite sidewalls that extend to and terminate at a top surface;
    separating an upper portion of each sidewall from the dielectric material;
    locating a barrier material between the upper portion of each sidewall and the dielectric material by depositing the barrier material over the cavity sidewalls and the cavity bottom; and
    forming an upper conductive contact over the lower conductive contact by:
    forming a dielectric layer over the lower conductive contact;
    etching the dielectric layer to form a cavity overlying the lower conductive contact, wherein the cavity is bordered by cavity sidewalls and a cavity bottom; and
    depositing the barrier material over the cavity sidewalls and cavity bottom.

14. The method of claim 13, wherein forming the upper conductive contact over the lower conductive contact further comprises:
    depositing a liner over the barrier material; and
    depositing a metal over the liner.

15. The method of claim 14, wherein:
    the lower conductive contact comprises ruthenium;
    the barrier material comprises a metal nitride;
    the liner comprises cobalt; and
    the metal comprises copper.

16. A method, comprising:

forming a conductive structure over a substrate, wherein the conductive structure has a first sidewall intersecting a top surface at a first joint, and a second sidewall intersecting the top surface at a second joint;

forming a first pocket adjacent to the first sidewall and a second pocket adjacent to the second sidewall, wherein each pocket extends downwardly from the top surface; and forming a barrier layer over the conductive structure, wherein the barrier layer includes a first projection extending downward along the first sidewall into the first pocket, a second projection extending downward along the second sidewall into the second pocket, and a lateral bridge portion over the top surface and interconnecting the first projection and the second projection, wherein the barrier layer comprises a metal nitride.

17. The method of claim 16, wherein forming the conductive structure over the substrate comprises forming the conductive structure in a dielectric material, and wherein forming the first pocket and the second pocket comprises removing a portion of the first sidewall of the conductive structure and a portion of the second sidewall of the conductive structure and/or removing a portion of the dielectric material adjacent to the first sidewall and the second sidewall.

18. The method of claim 16, further comprising forming a first portion of an etch stop layer in the first pocket and a second portion of the etch stop layer in the second pocket.

19. The method of claim 18, wherein forming the conductive structure over the substrate comprises forming the conductive structure in a dielectric material and planarizing the dielectric material and the conductive structure to a top surface of the dielectric material and the top surface of the conductive structure; and forming the first portion of the etch stop layer in the first pocket and the second portion of the etch stop layer in the second pocket comprises forming the etch stop layer over the top surface of the dielectric material and the top surface of the conductive structure and within the first pocket and within the second pocket.

20. The method of claim 19, wherein planarizing the dielectric material and the conductive structure to the top surface of the dielectric material and the top surface of the conductive structure comprises forming the first pocket adjacent to the first sidewall and the second pocket adjacent to the second sidewall.

\* \* \* \* \*